(12) United States Patent
Van Helvoort et al.

(10) Patent No.: US 8,155,101 B2
(45) Date of Patent: Apr. 10, 2012

(54) METHOD AND ARRANGEMENT FOR WIRELESS COMMUNICATION OF SIGNALS IN A MR SYSTEM

(75) Inventors: Marinus Johannes Adrianus Maria Van Helvoort, Eindhoven (NL); Jeff Bennett, Spring Valley, NY (US); Marc Paul Saes, Eindhoven (NL); Lambertus De Vries, Eindhoven (NL); Johannes Hendrik Den Boef, Eindhoven (NL); Robert Paul Kleihorst, Eindhoven (NL); Dagnachew Birru, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 839 days.

(21) Appl. No.: 12/097,554

(22) PCT Filed: Dec. 20, 2006

(86) PCT No.: PCT/IB2006/054968
§ 371 (c)(1),
(2), (4) Date: Jun. 16, 2008

(87) PCT Pub. No.: WO2007/072438
PCT Pub. Date: Jun. 28, 2007

(65) Prior Publication Data
US 2008/0259897 A1    Oct. 23, 2008

(30) Foreign Application Priority Data
Dec. 23, 2005  (EP) ...................................... 05112875

(51) Int. Cl.
*H04J 3/00*    (2006.01)

(52) U.S. Cl. ....................................................... 370/345
(58) Field of Classification Search .................. 370/345, 370/347
See application file for complete search history.

(56) References Cited

U.S. PATENT DOCUMENTS

| | | | |
|---|---|---|---|
| 5,384,536 A | 1/1995 | Murakami et al. | |
| 5,999,838 A * | 12/1999 | Crowley et al. | 600/410 |
| 6,704,592 B1 | 3/2004 | Reynolds et al. | |
| 7,173,426 B1 * | 2/2007 | Bulumulla et al. | 324/318 |
| 7,548,787 B2 * | 6/2009 | Feher | 607/60 |
| 7,914,442 B1 * | 3/2011 | Gazdzinski | 600/109 |
| 2003/0078004 A1 * | 4/2003 | Vester | 455/42 |
| 2005/0107681 A1 | 5/2005 | Griffiths | |
| 2006/0261986 A1 * | 11/2006 | Lazar | 341/50 |

FOREIGN PATENT DOCUMENTS

WO    0192907 A2    12/2001

(Continued)

OTHER PUBLICATIONS

Wright, S.W., and Porter, J.R.: "Parallel acquisition of MR images using time multiplexed coils", Electron. Lett., 1992, 28, pp. 71-72.*

(Continued)

*Primary Examiner* — Jeffrey Pwu
*Assistant Examiner* — Scott M Sciacca

(57) ABSTRACT

A method and an arrangement for uni- or bidirectional wireless communication of signals or data especially in a reflective environment like a MR imaging system, between at least one first transmitter and/or receiver unit (501, 601, 701; T/R1) and at least one second transmitter and/or receiver unit (801; T/R2) is disclosed. The reliability and availability of the communication link especially in a highly reflective environment is improved especially by using spread spectrum technology and ultra wide band carrier frequencies.

13 Claims, 2 Drawing Sheets

FOREIGN PATENT DOCUMENTS

Figure 1:
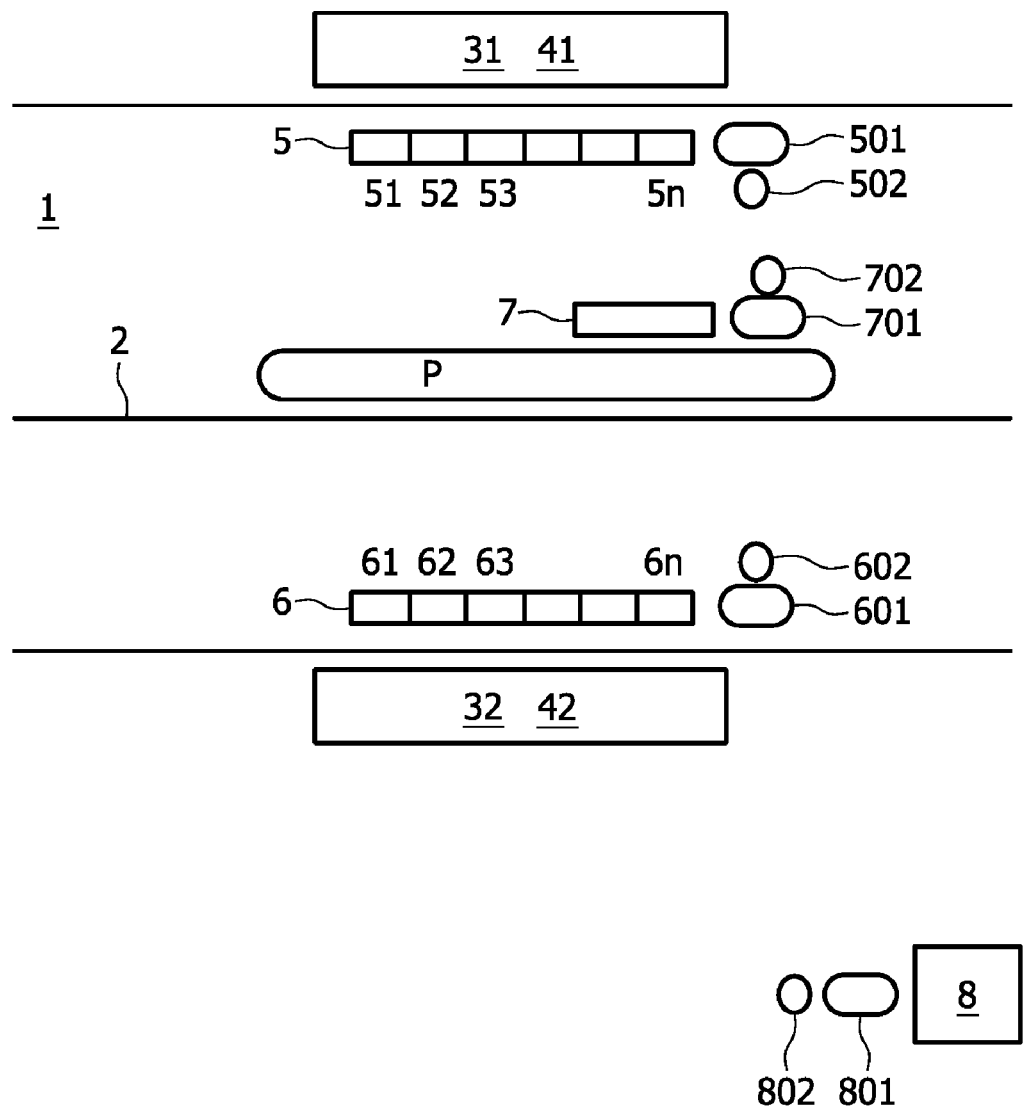

| WO | 02084624 A1 | 10/2002 |
|---|---|---|
| WO | 03032002 A1 | 4/2003 |
| WO | 2006099011 A1 | 9/2006 |

OTHER PUBLICATIONS

Porter, J.R., and Wright, S.M.: "A Modular Time Domain Multiplexer for Large Array Magnetic Resonance Imaging", Engineering in Medicine and Biology Society, 1994. Engineering Advances: New Opportunities for Biomedical Engineers. Proceedings of the 16th Annual International Conference of the IEEE, Nov. 3-Nov. 6, 1994, pp. 564-565.*

Bankson, J.A., and Wright, S.M.: "Time Domain Multiplexing for Multichannel Non-Fourier Spatial Encoding", Proceedings—19th International Conference—IEEE/EMBS Oct. 30-Nov. 2, 1997, pp. 453-455.*

Caimi, F. M., et al.; Antenna Diversity in Wireless Local Area Network Devices; 2002; http://www.skycross.com/technology.

Geevarghese, R., et al.; Adaptive Frequency Diversity using OFDM for Wireless Communications; 2003; http://www.ieeexplore.ieee.org/iel5/8688/27521/01226018.pdf.

Jorgensen, T.; Diversity—how to design the ideal cordless phone; 2003; RTX: Technical Articles; http://www.rtxtelecom.com/Default.aspx.

Scott, G., et al.; Wireless Transponders for RF Coils: Systems Issues; 2005; Proc. Int'l. Soc. Mag. Reson. Med.; 13:330.

Sethi, M., et al.; Digitising the Wireless MRI Link: A space-time CDMA Approach; 2001; IEEE Trans. on Intelligent Information Systems; pp. 31-36.

* cited by examiner

METHOD AND ARRANGEMENT FOR
WIRELESS COMMUNICATION OF SIGNALS
IN A MR SYSTEM

The invention relates to a method and arrangement for uni- or bidirectional wireless communication of signals or data especially in an electromagnetically reflective environment like a MR imaging system, between at least one first transmitter and/or receiver unit and at least one second transmitter and/or receiver unit. The invention further relates to a MR imaging system comprising such an arrangement.

Magnetic resonance imaging is a well-known noninvasive medical diagnostic method for examining a body tissue. The spins of the nuclei of the tissue are aligned in a strong magnetic field and then excited by transmitting RF pulses with the Larmor frequency by means of at least one RF pulse-transmitting device (RF antenna).

The magnetic resonance or relaxation of the spins of the nuclei is detected by one or a plurality of the same or other RF antennas or sensors, like for example in the form of relatively large body coils, and/or by one or more surface coils for certain parts of a body, like a head coil, and/or small detector coils at the tip of a catheter. On the basis of the received or detected MR signals, images of the body tissue with high quality and a high resolution can be generated by means of an image reconstruction device, or the signals are processed in another way by one or more processing devices.

In order to receive or detect the MR signals, the antennas, sensors or coils must be positioned in close proximity to the body to be examined. Furthermore, they have to be connected to the processing device for processing the detected signals and for generating images.

Conventionally, the antennas, sensors and coils are connected with the processing device by means of cables. However, especially in case of a large number of such antennas, sensors or coils (in the following commonly designated as "coils"), it is cumbersome and disadvantageous to have a corresponding large number of cables running from each coil through the examination space of the MR system to the processing device, especially because an efficient workflow is impaired by the cables. Furthermore, such cables represent a risk of harm to the patient because they may heat up from the transmitted RF pulses.

Consequently, various attempts have been made to provide a wireless communication of the received or detected MR data from the coils to the reconstruction device (or one or more of any other related data processing devices).

US 2005/0107681 A1 discloses systems, methods and associated devices for wirelessly communicating physiologic signals or other data obtained from a sensor module, in an electromagnetically noisy environment such as a magnetic resonance imaging suite, to a remote apparatus.

Such a sensor module substantially comprises a first transducer for converting the data received by the sensor from optical format to electrical format and a first RF transceiver for transmitting the converted data to a remote apparatus. Remote from the sensor module, a second RF transceiver for receiving the transmitted signals and a second transducer for converting the received signals from electrical format to optical format and for conveying the signals to the remote apparatus is provided, wherein the communication between the sensor module and the apparatus is accomplished without adversely affecting, or being adversely affected by, the operation of the MR system.

One embodiment of such a system uses broadband antennas or antennas that operate at frequency multiples to allow for communication at several frequencies. Furthermore, multiple antennas are disclosed to be useful for antenna diversity as a way to deal with the effects of multipath signal transmission, especially in the MR scanner room which is likely to be a highly reflective environment due to the metal shielding and the equipment typically located therein. It is preferable in such a system to place any directive antennas for increased signal gain in a control room, where multipath effects are likely to be less than those in the scanner room.

However, multiple RF antennas within the scanner room or examination space of a MR system create problems due to the fact that such a room or space is usually very limited.

Furthermore, it has to be considered that especially future MR systems require an extensive parallel imaging of sensor signals if e.g. the coils comprise a plurality of separate coil elements which have to be independently controlled and supplied for transmitting RF pulses and/or for receiving MR signals and which each require an own transmission or communication channel to the reconstruction or signal processing device.

The required bandwidth for such multi-band signal transmissions increases considerably with the number of channels. If for example the analog bandwidth of a received MR signal is about 1.5 MHz, for 128 channels a bandwidth of 192 MHz is required. For the transmission of such a broadband signal a high frequency carrier is necessary which is typically in or near the GHz range.

However, the higher the frequency carrier is, the more multipath effects will be caused. Since the examination space and the RF cage around the scanner of the MR system are highly reflective, increased reflections, diffractions and scattering will occur. Furthermore, due to interference at some points in the surroundings, the reflections will extinguish the transmitted RF signals at certain locations, while at other locations they will amplify each other.

This problem is further increased especially in case if the coils or sensors for detecting MR signals and thus also the RF antenna(s) for the wireless communication of the detected MR signals are moved through the examination space of the MR imaging system because the interference pattern changes from location to location, so that it cannot be ensured that the communication link between the RF antenna and the receiver remains at a sufficient level in all locations.

Finally, the interference pattern is also modified by the patient who is examined and moved through the examination space, and the interference pattern will change from patient to patient as well.

An object underlying the invention is to provide a method and arrangement for uni- or bidirectional wireless communication of signals or data especially in a reflective environment like a MR imaging system, between at least one first transmitter and/or receiver unit and at least one second transmitter and/or receiver unit, by which an at least substantially disturbance free communication can be conducted between said units.

Especially, it is an object of the invention to provide such a method and arrangement by which multipath-, frequency fading or interference effects can be considerably decreased or avoided especially in case of using high carrier frequencies.

In accordance with one aspect of a solution, at least one first and at least one second transmitter and/or receiver unit perform a simultaneous or alternative communication with each other by means of at least two different carrier frequencies, which are selected and/or controlled in dependence on a selected position of at least one of the first and/or second transmitter and/or receiver unit or its antenna within the environment, so that at least one of the frequencies enables an at least substantially disturbance-free communication between both.

An advantage of this solution is the fact, that the method and arrangement according to the invention can be used as well for transmitting e.g. control signals from the MR signal-processing device to the MR signal detection device in order for e.g. independently controlling separate RF antennas or MR coil elements.

Figure 2:
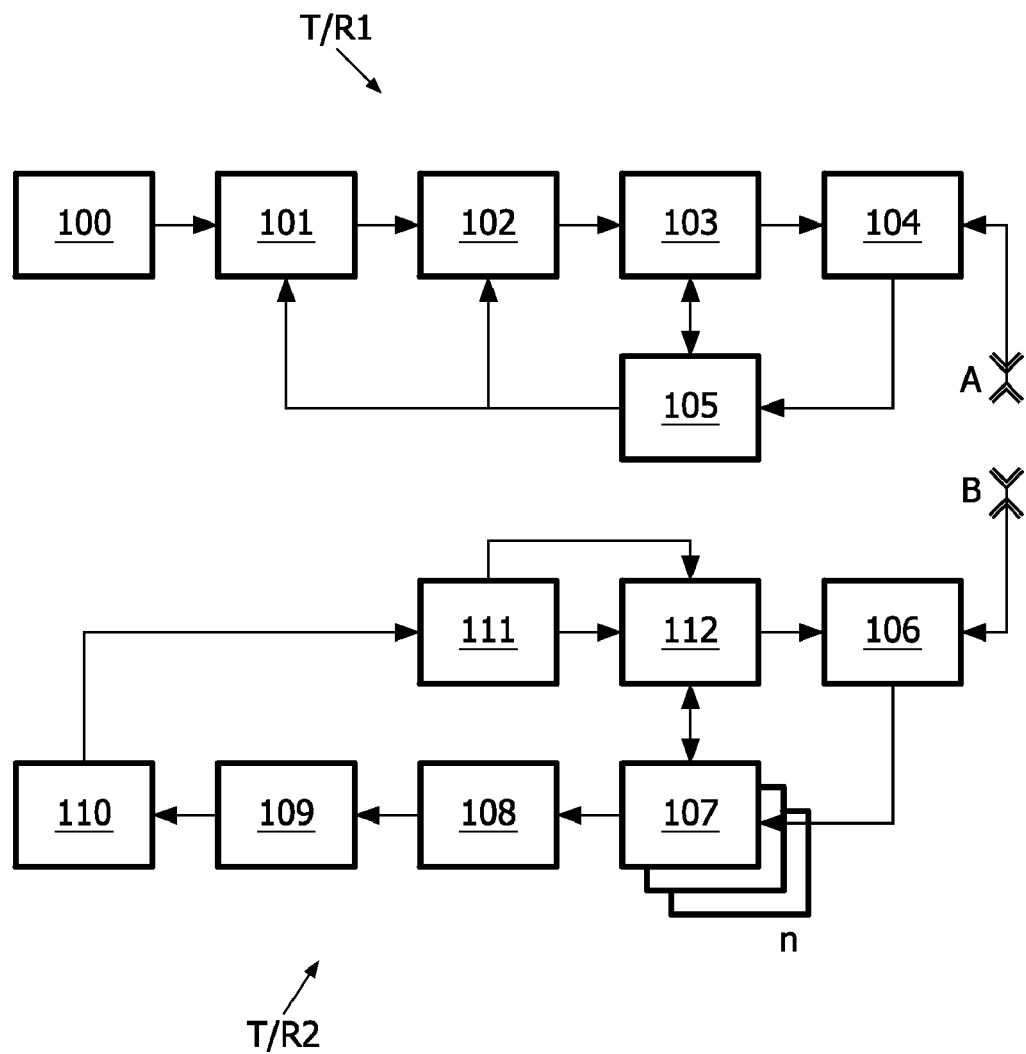

Further details, features and advantages of the invention are disclosed in the following description of exemplary and preferred embodiments of invention with reference to the drawings in which shows:

FIG. 1 a schematic block diagram of substantial parts of a MR system comprising an embodiment of an arrangement for wireless communication of data according to the invention, and FIG. 2 a schematic block diagram of substantial electronic components of such an arrangement for wireless communication of data.

FIG. 1 shows schematically a longitudinal section through a cylindrical or tubular examination space (or scanner room) 1 of a MR system. A patient table 2 for carrying a patient or another examination object P is guided in an axial direction through the cylindrical space 1.

The system comprises main magnets 31, 32 for generating a static magnetic field ($B_0$ field) for aligning the spins of the nuclei in the tissue to be examined.

The system furthermore comprises gradient magnet coils 41, 42 for generating magnetic fields having a gradient in the three orthogonal directions (x-, y- and z-direction) in order to enable a spatial or slice selection and spatial encoding of the received MR signals in a known manner.

A plurality of transmitting coils is provided for transmitting RF excitation pulses ($B_1$ field) to excite the nuclei, and a plurality of detection coils is provided for receiving and detecting the MR relaxation signals emitted from the nuclei.

More in detail, a first and second stationary body coil 5, 6 for imaging the whole body of a patient is provided, for example in the form of a conductor structure on a plane carrier like a circuit board. Such a conductor structure can be divided into a plurality of coil elements 51, 52, . . . 5n; 61, 62, . . . 6n, which can be controlled independently from each other for transmitting RF signals and/or for receiving MR signals.

Furthermore, one or a plurality of third mobile surface coils 7 for certain parts of a body like a head coil and/or a detector coil at the tip of a catheter for receiving MR signals from definite areas of a patient P are provided which are designated commonly with the reference number 7.

The devices for controlling these first to third coils 5, 6, 7 and/or coils elements 51, 52, . . . 5n; 61, 62, . . . 6n and for processing and evaluating the detected MR signals and/or for generating images are schematically indicated commonly by reference number 8. A more detailed explanation of such devices is for example disclosed in the above mentioned prior art document US 2005/0107681 A1 which by reference is made to a part of this disclosure.

For transmitting the detected MR signals to the related data processing, evaluating and/or image reconstruction device or other analysis equipment (MR signal processing device) 8, as well as for controlling e.g. the coil segments 51, 52, . . . 5n; 61, 62, . . . 6n of the body coils 5, 6 for transmitting RF signals and receiving MR signals, an arrangement for the wireless communication between said antennas, coils, coil elements and/or other sensors 5, 6, 7 ("MR signal detection device") and said MR signal processing device 8 is provided.

Generally, such an arrangement comprises according to FIG. 1 at the MR signal detection devices 5, 6, 7 a first unit 501; 601; 701 for transmitting detected MR signals, respectively, each with an associated first RF antenna 502; 602; 702, respectively. The related MR signal-processing device 8 is provided with or comprises a second unit 801 for receiving such signals with an associated second RF antenna 802.

In order to conduct a communication from the MR signal-processing device 8 to at least one of the MR signal detection devices 5, 6, 7, the second unit 801 can be provided additionally as a transmitter unit for transmitting signals. Correspondingly, at least one of the first transmitter units 501, 601, 701 can be provided additionally as a receiver unit for receiving these signals, which are e.g. control signals for selecting certain coil elements 51, 52, . . . ; 61, 62, . . . in case of the body coils 5; 6, and/or for setting a desired configuration e.g. in order to conduct an examination and/or for transmitting detected fault situations, etc.

The first and second antennas 502, 602, 702; 802 are provided either as a part of the associated first and second transmitter and/or receiver unit 501, 601, 701; 801, respectively, or they are connected with such a unit 501, 601, 701, 801 via a cable for independently positioning the related antenna 502, 602, 702, 802 (for example in the form of small coils) appropriately.

Regarding an exemplary antenna positioning, reference is made to FIG. 1, according to which one first transmitter and/or receiver unit 501 and/or antenna 502 is located at the upper body coil 5. Another first transmitter and/or receiver unit 601 and/or antenna 602 is located at the lower body coil 6 and another first transmitter and/or receiver unit 701 and/or antenna 702 is located at the RF surface coil 7. Furthermore, the second transmitter and/or receiver unit 801 and/or the second antenna 802 is positioned such that the patient is not between the line of sight of the first antennas 502, 602, 702 on the one hand and the second antenna 802 on the other hand.

In case that this is difficult to guarantee in all instances, if e.g. the patient is moved to a great extent through the examination space 1, additional antennas and/or multiple antennas can be added. Such multiple antennas can also be used to improve the overall bandwidth.

A preferred embodiment with which these difficulties can be avoided in most cases comprises four transmitter and/or receiver units 501, 601, 701 and/or their antennas 502, 602, 702, namely one on top of the patient P, one at the upper system body coil 5, one under the patient P, and one at the lower system body coil 6. Additionally or alternatively, at least one of these units 501, 601, 701 and/or their antennas 502, 602, 702 can be located at the wall of the RF cage of the scanner room 1.

Furthermore, additionally or alternatively, one or more transmitter and/or receiver units 501, 601, 701, 801 and/or their antennas 502, 602, 702, 802 are preferably positioned near or in the opening of the examination space (scanner room) 1, preferably at both opposite openings.

Usually, the data communications between each MR signal detection device 5, 6, 7 on the one hand and the MR signal processing device 8 on the other hand has to be conducted independently from each other and in parallel so that a corresponding number n of independent data communication channels (three channels according to FIG. 1) have to be provided.

As mentioned above, especially in case of a large number n of such communication channels a considerable bandwidth is required, and consequently a related high-frequency carrier is necessary for the transmission of such broadband signals.

Especially in this case, multipath effects or frequency selective fading and interferences may interrupt or disturb the data communication.

In order to avoid this, according to a first embodiment of the invention the data communication is conducted in each channel by means of at least two different carrier frequencies which are used simultaneously or alternatively, which frequencies are manually or automatically selected and/or controlled in dependence on e.g. the amount and/or variations of the field strength received at the MR signal processing device 8 such that at a user-selected position of the transmitter and/or the receiver unit 501, 601, 701 (or of the associated antenna 502, 602, 702) in the MR imaging system, at least one of the frequencies enables a communication which is at least substantially free of multipath-, frequency fading and interference effects or other detrimental effects due to reflections.

Since at every frequency the interference pattern is different, a continuous communication availability and reliability without these effects can be significantly improved by appropriately selecting or controlling such frequencies.

A further such improvement can be achieved by using multiple antennas 502, 602, 702, 802 for at least one of the transmitter and/or receiver units 501, 601, 701, 801 at the same or different frequencies which are preferably additionally selected and/or controlled as described above.

Preferably, the detected MR- and/or control-signals transmitted in a communication channel are transmitted at four different carrier frequencies simultaneously, especially by orthogonal frequency division multiplexing (OFDM).

Generally, the frequency bands and/or frequency values can be determined during the MR system design phase in dependence on measured channel characteristics and a required bandwidth or data throughput. On the other hand, the expected data throughput can be calculated on the basis of the channel characteristics and the selected frequency bandwidths.

In this way, the frequencies are preferably pre-set for the whole arrangement, and they can preferably be tuned or optimized by a service engineer and/or the user of the MR imaging system or automatically, in dependence on detected communication conditions like the strengths of received signals etc. as described above in an actual system setup.

According to a second embodiment of the invention, the spread spectrum technique using wide band signals or UWB (ultra wide band) technique according to the prior art can be applied in at least one of the communication channels between at least one MR signal detection device 5, 6, 7 and the MR signal processing device 8.

Especially in case of using the UWB technology, the transmitted power is preferably increased further above the noise level. The additional power can be used to improve the signal-to-noise ratio and thus to increase the data rate and to decrease the bit error rate. The RF cage which usually surrounds the examination space (scanner room) 1 will ensure that outside the examination space 1 the legal requirements regarding maximum electromagnetic radiation are met.

According to a third embodiment of the invention, a time division multiplexing of the communication channels can be used, preferably in addition to the spread spectrum technique. In this case, every transmitter and/or receiver unit 501, 601, 701, 801 transmits its spread spectrum signals in a specific allocated time slot. This is especially advantageous if several transmitter and/or receiver units 501, 601, 701, 801 and/or multiple antennas 502, 602, 702, 802 are used close to each other in geometric space in order to avoid or diminish disturbances or signal conflicts due to out of phase transmissions.

Alternatively, different subsets of sub-channels can be allocated to each said unit and/or antenna.

FIG. 2 shows a schematic and exemplary block diagram of the electronic components of a preferred embodiment of an arrangement for wireless communication of data in a MR system, comprising a first transmitter and/or receiver unit T/R1, like one of the above described first transmitter and/or receiver units 501; 601; 701 at a MR coil 5, 6, 7, including a corresponding antenna 502; 602; 702, and a second transmitter and/or receiver unit T/R2, like the above described second transmitter and/or receive unit 801 at, or as a part of a MR signal processing device 8 including a corresponding antenna 802.

Preferably, each such a transmitter and/or receiver unit T/R1 is provided for each channel, i.e. for each coil 5, 6, 7, so that in a system according to FIG. 1 in total three (n=3) such first transmitter and/or receiver units T/R1 and one second transmitter and/or receiver unit T/R2 are provided in the arrangement for wireless communication.

Such a first transmitter and/or receiver unit T/R1 comprises a MR signal detector 100 for detecting the MR signals received by the associated coil 5, 6, 7, a configurable low noise amplifier (LNA) comprising detuning means 101 for amplifying the detected MR signals and for generating a signal in the 65 MHz or 128 MHz frequency band with a bandwidth of about 1.5 MHz, a MR receiver 102 with a configurable datarate for generating an output signal with e.g. a datarate of 12 MB/s from the amplified MR receiver signal, an UWB transmitter 103 which is supplied with the output signal of the MR receiver 102, for generating an UWB signal which is supplied with a datarate of e.g. 480 MB/s to a first physical interface 104 in the form of, or including at least one antenna A, for transmitting and receiving UWB signals.

Furthermore, an UWB receiver 105 is provided for receiving signals via the antenna A and the first physical interface 104, which are e.g. transmitted by the data-processing device 8 for controlling or configuring the UWB transmitter 103 and/or for controlling or configuring the datarate of the MR receiver 102 and/or for controlling or configuring the low noise amplifier (LNA) and detuning means 101.

Preferably, the MR signal detector 100 comprises an AD-converter which can be synchronized with the system clock via clock recovery in the UWB path. Alternatively, a free running clock can be used for compensating phase differences during MR image reconstruction. These phase differences can be determined before by means of a special calibration method or a signal correlation.

The second transmitter and/or receiver unit T/R2 comprises a second physical interface 106 in the form of, or including at least one antenna B, for transmitting and receiving UWB signals.

According to the number n of channels of the arrangement for wireless communication, a corresponding number n of UWB receivers 107 is provided, to which the UWB signals (MR signals) transmitted by each of the first transmitter and/or receiver unit T/R1 in each channel and received by the second physical interface 106, are supplied.

The received MR signals are merged and processed in a known way by a merger 108 and are supplied to a data processing or image reconstruction device 109 in order to generate MR images and/or to process the received MR signals in another known way.

Furthermore, a user interface 110 is provided for controlling a scan control means 111 which itself controls and configures an UWB transmitter 112 for transmitting control signals via the second physical interface 106 to the first physical interface 104 of a selected channel. By this, a user can e.g.

select or control certain coil elements 51, 52, . . . 5*n*; 61, 62, . . . 6*n* of a coil 5; 6 of the related channel as mentioned above, or the user can control or configure the UWB transmitter 103 and/or the datarate of the MR receiver 102 and/or the low noise amplifier (LNA) and detuning means 101 of the first transmitter and/or receiver unit T/R1 of the selected channel.

The method and arrangement according to the invention is not only applicable in MR imaging systems, but e.g. as well in other systems or environments which are subject especially to multipath-, frequency fading- or interference effects or other effects of reflective environments, when wirelessly transmitting signals or data between at least one first and at least one second transmitter and/or receiver unit

The invention claimed is:

1. An MR imaging system disposed in an RF shielded room which causes RF reflections, RF diffractions, RF scattering, multipath effects, frequency selective fading, RF interferences, and disruptions, the MR imaging system including:
   an MR examination space which receives a subject to be examined, the MR examination space being disposed in the RF shielded room;
   a plurality of magnetic resonance coils disposed in the examination space to receive magnetic resonance signals from a subject in the examination space as magnetic resonance data;
   a plurality of RF communication channels which are time division multiplexed, each communication channel operating to concurrently send the magnetic resonance data from the magnetic resonance coils across the RF shielded room to downstream electronics and to send control information across the RF shielded to the MR coils, each communication channel comprising a first unit and a second unit, for transmitting and receiving spread spectrum UWB (ultra wide band) signals, the first unit being disposed in the examination space and the first and second units including:
      a first unit transmitter which transmits spread spectrum UWB signals carrying the magnetic resonance data across the shielded room to the downstream electronics and a first unit receiver which receives spread spectrum UWB signals carrying the control information from across the shielded room, and
      at least one second unit transmitter which transmits the control information carried on the spread spectrum UWB signal across the shielded room to the first unit receiver and a second unit receiver which receives the spread spectrum UWB signal carrying the MR data from the first unit transmitter, the second unit receiver being connected with the downstream processing equipment,
   such that the MR coils are independently controlled over the plurality of communication channels and wirelessly transmit the MR data to the downstream electronics.

2. The MR imaging system according to claim 1, in which at least one of the first unit transmitter and an associated antenna are positioned on a magnetic resonance coil located at each of an upper body, lower body, and mobile surface location.

3. The MR imaging system according to claim 2, in which at least one of the first unit transmitter and an associated antenna are positioned on opposite openings of the examination space.

4. The MR imaging system according to claim 1, wherein the first unit and the second unit are provided each with at least one independently positionable antenna, wherein the first unit antenna is located on the local magnetic resonance coil, the first unit antenna being independently positioned within a cylindrical bore which surrounds the examination space of the MR imaging system by control signals received from the second unit transmitter by the first unit receiver to provide line of sight communication with the second unit antenna.

5. A magnetic resonance (MR) imaging system comprising:
   an RF shielded room which houses an MR imaging device, the RF shielded room causing RF reflections, RF diffractions, RF scattering, multipath effects, frequency selective fading, RF interferences, and disruptions, the MR imaging device including:
      an MR examination region which receives an object to be examined;
      a plurality of MR coil elements which receive MR data from the object in the examination region;
   a plurality of RF communication channels which operate to concurrently send the MR data from each of the plurality of MR coil elements across the RF shielded room to downstream electronics and to send control information across the RF shield room to the MR coil elements, each communication channel including:
      a first unit connected with one of the MR coil elements, the first unit including a transmitter which transmits spread spectrum UWB signals carrying the MR data across the shielded room to the downstream electronics and a first unit receiver which receives spread spectrum UWB signals carrying the control information from across the shield room, and
      a second unit which has at least one second unit transmitter which transmits the control information carried on the spread spectrum UWB signals across the shielded room to the first unit receiver and a second unit receiver which receives the spread spectrum UWB signal carrying the MR data from the first unit transmitter, the second unit receiver being connected with the downstream processing equipment,
   such that the MR coil elements are independently controlled over the plurality of communications channels and concurrently wirelessly transmit the MR data to the downstream electronics.

6. The magnetic resonance (MR) imaging system according to claim 5, wherein the examination region is cylindrical and the first unit is positioned within the cylindrical examination region of the MR imaging system and the second unit is positioned outside the RF shielded room.

7. The MR imaging system according to claim 6, wherein the first unit and the second unit are provided each with at least one independently positionable antenna, wherein the first unit antenna is located on one of the MR coil elements and the second unit antenna is located on the inside wall of the RF shielded room facing the MR imaging device, the first unit antenna positioned within line of sight to the second unit antenna.

8. A magnetic resonance (MR) imaging system comprising:
   an RF shielded room which houses an MR imaging device, the RF shielded room causing RF reflections, RF diffractions, RF scattering, multipath effects, frequency selective fading, RF interferences, and disruptions, the MR imaging device including:
      an MR examination region which receives an object to be examined;
      a plurality of MR coil elements which receive MR data from the object in the examination region;
   a plurality of time division multiplexed RF communication channels which operate to concurrently send the MR data from each of the plurality of MR coil elements across the RF shielded room to downstream electronics and to send control information across the RF shield room to the MR coil elements, each communication channel including:
- a first unit connected with one of the MR coil elements, the first unit including a first unit transmitter which transmits spread spectrum signals carrying the MR data across the shielded room to the downstream electronics and a first unit receiver which receives spread spectrum signals carrying the control information from across the shield room, and
- a second unit which has at least one second unit transmitter which transmits the control information carried on the spread spectrum signals across the shielded room to the first unit receiver and a second unit receiver which receives the spread spectrum signals carrying the MR data from the first unit transmitter, the second unit receiver being connected with the downstream processing equipment, such that the MR coil elements are independently controlled over the plurality of communications channels and concurrently wirelessly transmit the MR data to the downstream electronics; and wherein the first and second unit transmitters and first and second unit receivers each have a plurality of antennas to improve overall bandwidth of spread spectrum signal transmission to remove signal interferences caused by movement in the RF shielded room.

9. The magnetic resonance (MR) imaging system according to claim 8, wherein the control information transmitted by the at least one second unit transmitter controls the plurality of antennas attached to first and second unit transmitters and first and second unit receivers to improve overall bandwidth of spread spectrum signal transmission to remove signal interferences caused by movement in the RF shielded room.

10. The magnetic resonance (MR) imaging system according to claim 9, wherein the control information is dependent upon a position of at least one of the first and second unit transmitters and their plurality of antennas and a position of at least one of the first and second unit receivers and their plurality of antennas.

11. The magnetic resonance (MR) imaging system according to claim 8, wherein the signals are redundantly transmitted on a plurality of frequencies.

12. The magnetic resonance (MR) imaging system according to claim 8, wherein the signals are orthogonal frequency division multiplexed.

13. The magnetic resonance (MR) imaging system according to claim 8, wherein the signals are transmitted using ultra wide band (UWB) technology.

* * * * *